United States Patent [19]

Villa et al.

[11] Patent Number: 5,784,252
[45] Date of Patent: Jul. 21, 1998

[54] ELECTRONIC PROCESSOR UNIT HAVING COMPONENTS MOUNTED ON A PIVOTAL FRAME WITH LOCK MECHANISM

[75] Inventors: Egidio Villa, Romano Canavese; Giuseppe Chiantaretto, Ozegna, both of Italy

[73] Assignee: Olivetti & C., S.p.A., Italy

[21] Appl. No.: 682,784

[22] PCT Filed: Jan. 23, 1995

[86] PCT No.: PCT/EP95/00237

§ 371 Date: Jul. 31, 1996

§ 102(e) Date: Jul. 31, 1996

[87] PCT Pub. No.: WO95/20785

PCT Pub. Date: Aug. 3, 1995

[30] Foreign Application Priority Data

Jan. 31, 1994 [IT] Italy .................. TO94A0046

[51] Int. Cl.$^6$ .................. G06F 1/16; H05K 7/16
[52] U.S. Cl. .................. 361/683; 361/726
[58] Field of Search .................. 312/223.2; 364/708.1; 361/683, 686, 724–727

[56] References Cited

U.S. PATENT DOCUMENTS 5,051,868  9/1991  Leverault et al. .................. 361/683
5,136,468  8/1992  Wong et al. .................. 361/683

FOREIGN PATENT DOCUMENTS 0 428 273 A2   5/1991   European Pat. Off. .
2 255 674      11/1992  United Kingdom .
WO 95/19594   7/1995   WIPO .................. G06F 1/18

*Primary Examiner*—Michael W. Phillips
*Attorney, Agent, or Firm*—Banner & Witcoff, Ltd.

[57] ABSTRACT

An electronic processor unit comprises a base (13) for supporting mechanical and electronic components (61,24) and an auxiliary frame (14) fixed to the base in order to support other mechanical and electronic components (16, 17). An interlocking mechanism (32) for the base and the auxiliary frame permits the frame to be pivoted between a rest position and a tilted position providing access to the said components, and a fixing mechanism (33) can be selectively actuated to lock the auxiliary frame to the base in the rest position.

9 Claims, 6 Drawing Sheets

ELECTRONIC PROCESSOR UNIT HAVING COMPONENTS MOUNTED ON A PIVOTAL FRAME WITH LOCK MECHANISM

BACKGROUND OF THE INVENTION

This invention relates to an electronic processor unit, comprising a base adapted to support first mechanical and electronic components, and an auxiliary frame adapted to support second mechanical and electronic components and to be fixed to the base in order to enclose the said second components.

Known electronic processor units, such as in personal computers, have frames, for supporting and housing the internal components, fixed to the base by means of rows of screws. This type of structure has the disadvantage that it makes it difficult to access the internal components of the processor unit, e.g. in order to replace a faulty part. Furthermore, tools are required to unscrew and tighten the various screws holding the components fixed to the base.

One such electronic unit is disclosed in European Patent Application EP-A-0 428 273, which concerns a computer having a frame carrying a power supply and which is pivotable for being selectively fixed by interlocking means to a base of the computer. The interlocking means comprise a threaded, spring-loaded fastener, which has to be screwed on the base for fixing the frame. The interlocking means have to be operated as a screw, so that the locking and the unlocking of the frame to and from the base are rather laborious.

SUMMARY OF THE INVENTION

An object of this invention is to provide an electronic processor unit in which it is simple to access both the mechanical and electronic internal components without the aid of tools, or without having to effect uncomfortable operations, such as unscrewing, and in which the auxiliary frame can be moved in a restricted manner in order to ensure access to these components.

This object is achieved by the present invention as defined in the characteristic portion of independent claim 1. Advantageous features of the invention are set forth in the appendant claims.

A preferred electronic processor unit embodying the invention is described below in more detail with reference to the drawings, and has a base supporting mechanical and/or electronic components, and an auxiliary frame fixed to the base and supporting other mechanical and/or electronic components. The auxiliary frame can be pivoted between a rest position and a tilted position providing access to the said mechanical and/or electronic components. Access to these components is thus simple and can be achieved without the need to use tools.

BRIEF DESCRIPTION OF THE DRAWINGS

Features of the invention will be made clear from the description of a preferred embodiment given by way of a non-limiting example and with reference to the accompanying drawings, in which.

DETAILED DESCRIPTION OF THE PREFERRED EMBODIMENT

Figure 1:
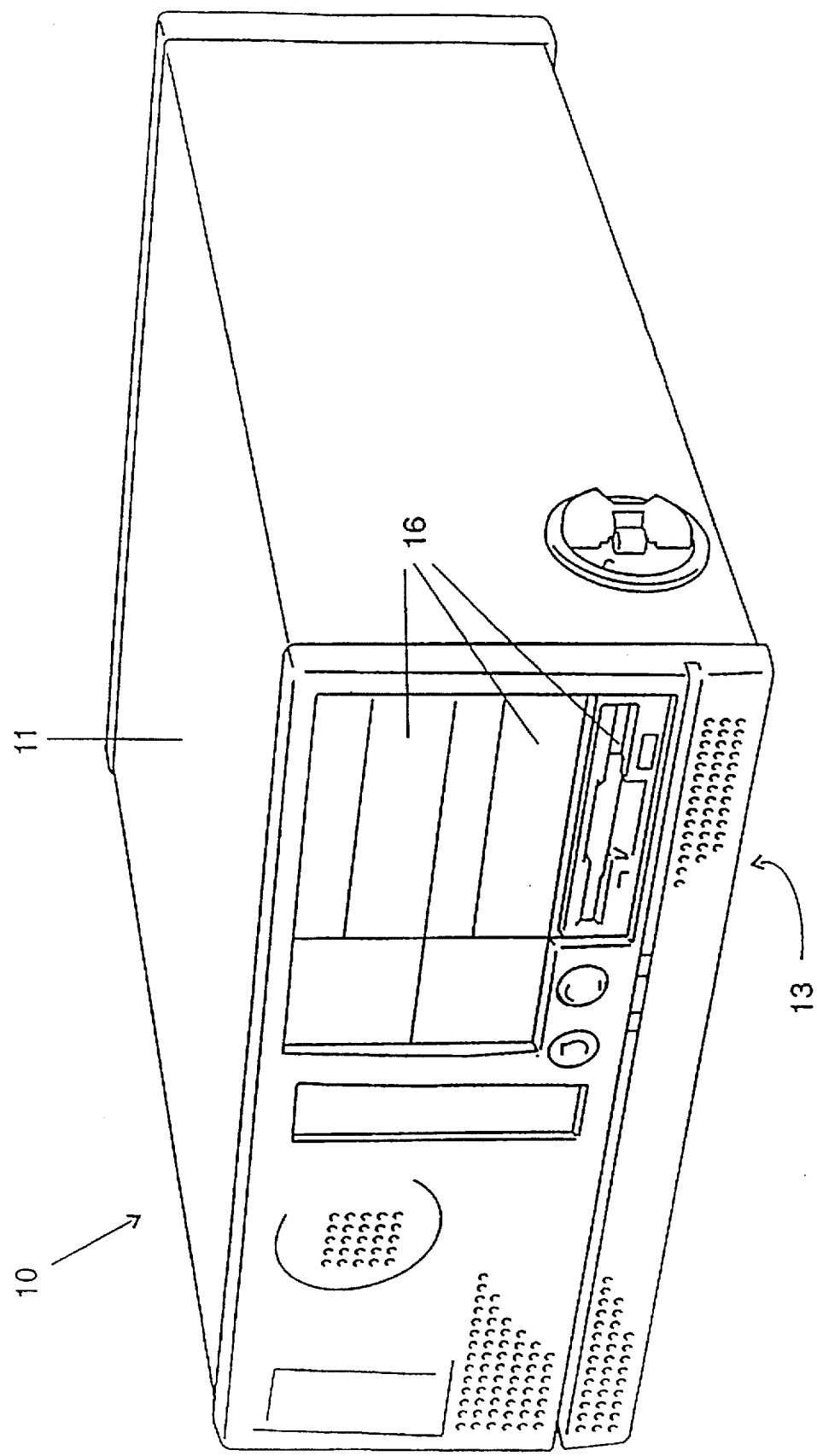
FIG. 1 is a perspective view of an electronic processor unit embodying the invention.

Referring to FIG. 1, the reference numeral 10 designates an electronic processor unit, e.g. of the personal computer type, hereinafter referred to by the abbreviation PC, comprising a cover 11 and a main frame 12, shown in detail in FIG. 2. The main frame 12 consists of a base 13 for supporting first mechanical and/or electronic components and an auxiliary frame 14 for supporting second mechanical and/or electronic components in a modular manner.

For the sake of brevity and simplicity of description, the cover 11, e.g. of conventional type or of a type closed by means of wing nuts as described in International Patent Application No. PCT/EP95/00095, publication No. W095/19594 published 20 Jul. 1995, in the name Ing. C. Olivetti & C., S.p.A., and also, the first and second mechanical and/or electronic components will not be described in detail as they are known per se. Only a magnetic (and/or optical) peripheral storage unit 16 and a power supply unit 17 will be mentioned. The power supply unit supplies various voltages to the first components on the base 13 and the second components on the auxiliary frame 14.

The base 13 comprises a rear wall 18, a front wall 19 and a generally-rectangular base wall 21 to which the first electronic and mechanical components of the PC are fixed.

The front wall 19 of the PC is provided in its right-hand part (FIG. 1-3 and 6) with an opening 22 for receiving the auxiliary frame 14 in the rest position, and in its left-hand part with a grille 23 for ventilation of the internal units, such as by a fan 24, and for a loudspeaker 26. A strip 27 is located centrally on the front wall 19 as a housing for an expansion peripheral for the PC, e.g. a magnetic cassette unit. The entire lower part of the front wall 19 consists of a rectilinear body 28 in which are provided a grille 29 for the ventilation of the peripheral unit 16 and a seat 31 adapted to house and support a first interlocking mechanism 32 for the base 13 and the auxiliary frame 14. A second interlocking mechanism 33 for the base and the auxiliary frame is moreover provided on the upper part of the front wall 19.

Figure 4:
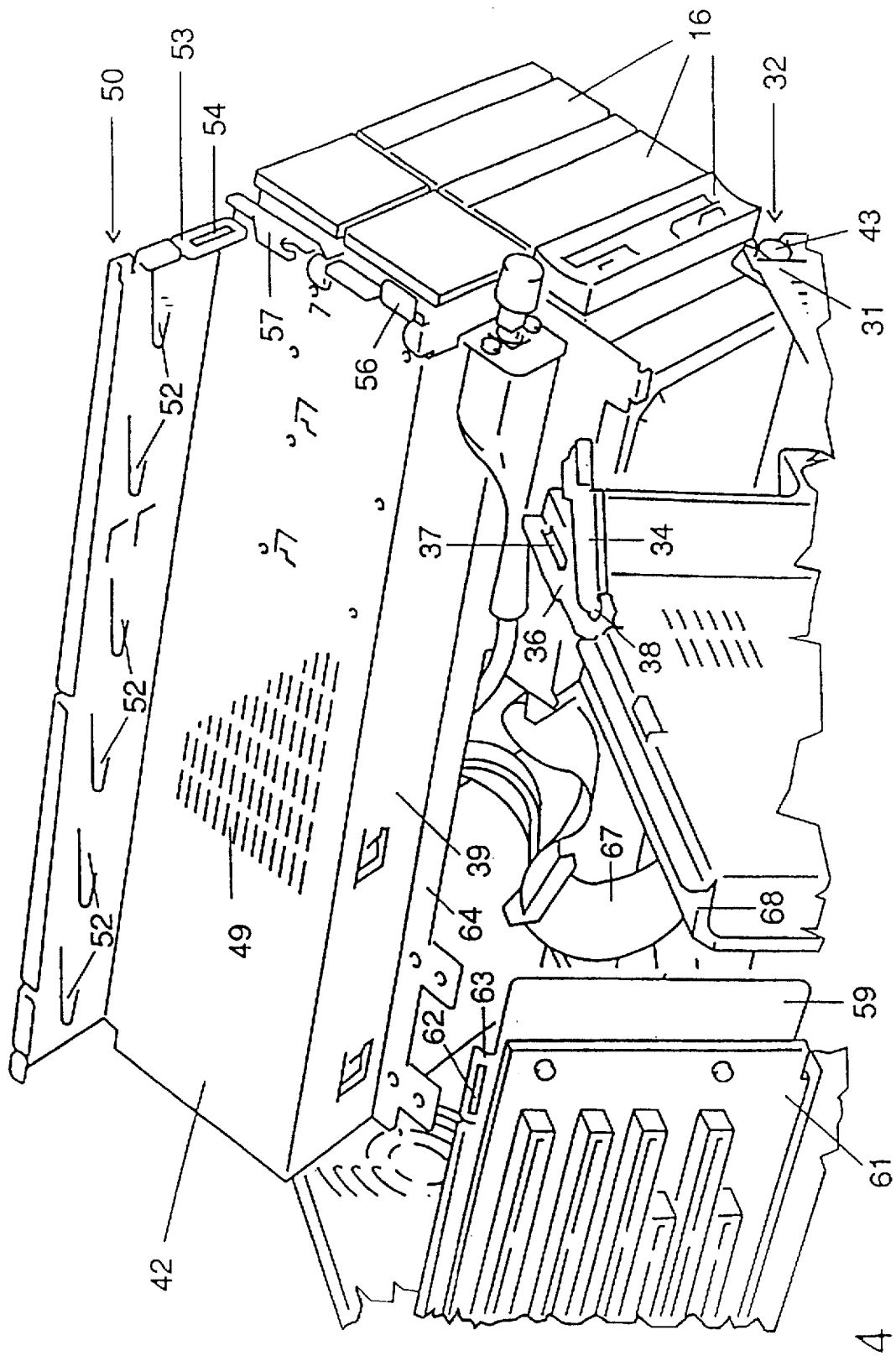
FIG. 4 is a view of a detail from FIG. 3.
Figure 5:
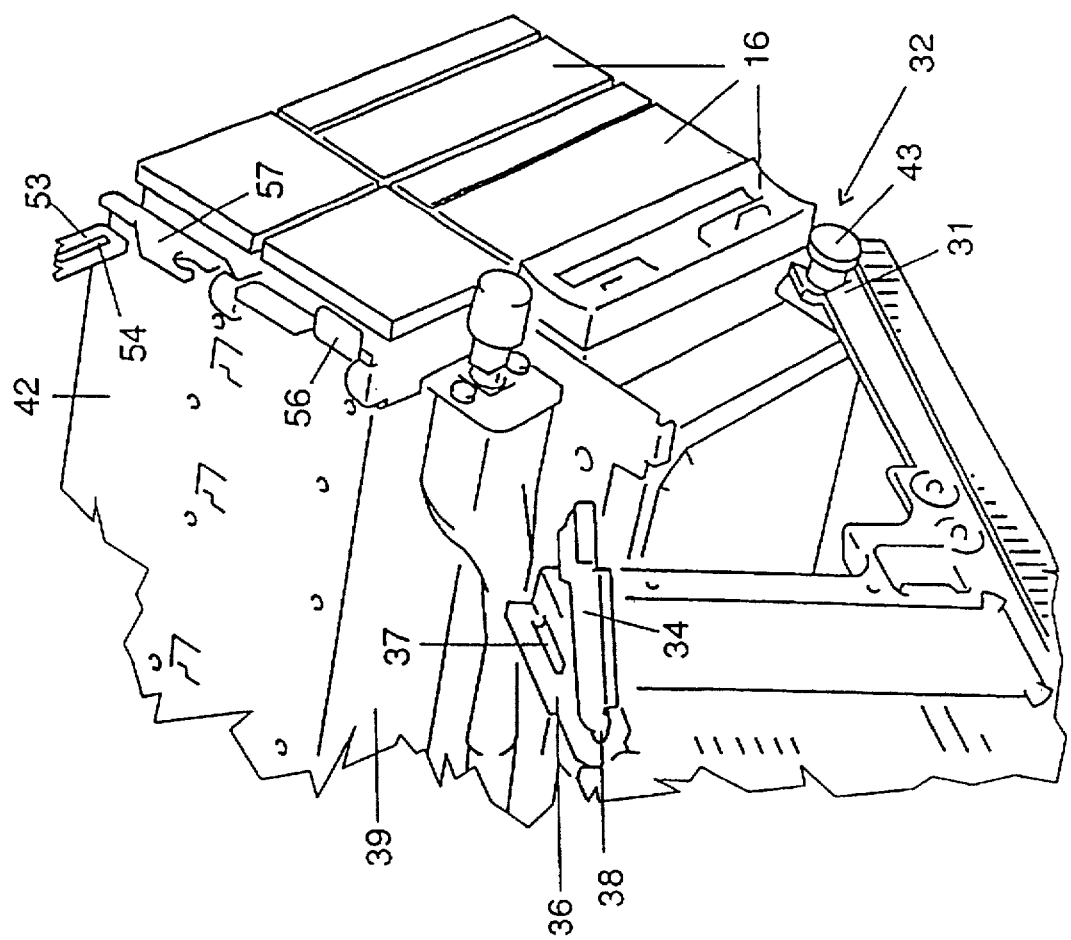
FIG. 5 is a view of another detail from FIG. 3.

Parts of the second or fixing mechanism 33 are situated centrally on the upper edge of the front wall 19 and are thus integral with the base, and comprise a bolt lever 34 (FIGS. 4 and 5) and a shoulder 36 in which a small hole 37 is formed. The lever 34 is free to rotate about a pivot 38 in order to engage, in the rest position, in the small hole 37.

The auxiliary frame 14, substantially in the shape of a parallelepiped, is delimited by a base 39, a right-hand side wall 41 (see FIG. 2) and a left-hand wall 42. The magnetic peripheral unit 16, the front part of which occupies the opening 22 in the front wall of the PC, and the power supply unit 17, the rear part of which simply constitutes the rear part of the frame 14, are mounted on the base 39.

The first interlocking mechanism comprises a pivot 43 integral with the base 39 and located in the seat 31 in its right-hand front part. Another first interlocking mechanism is located at the right-hand rear part of the base. These first interlocking mechanisms permit the pivoted rotation of the frame 14 about an axis along the side edge of the generally-rectangular base 13 from a rest position (FIG. 2), in which it is integrally locked with the base 13, to an access position (FIG. 3), in which it is tilted laterally upwards to allow for easy access to the first and second mechanical and electronic components. The frame thus rotates about an axis parallel to the base surface 21 and perpendicular to the front and rear walls 19,18. The frame may rotate by an angle of at least 45° up to about 90°; the extent of the rotation may be restricted as desired.

Figure 2:
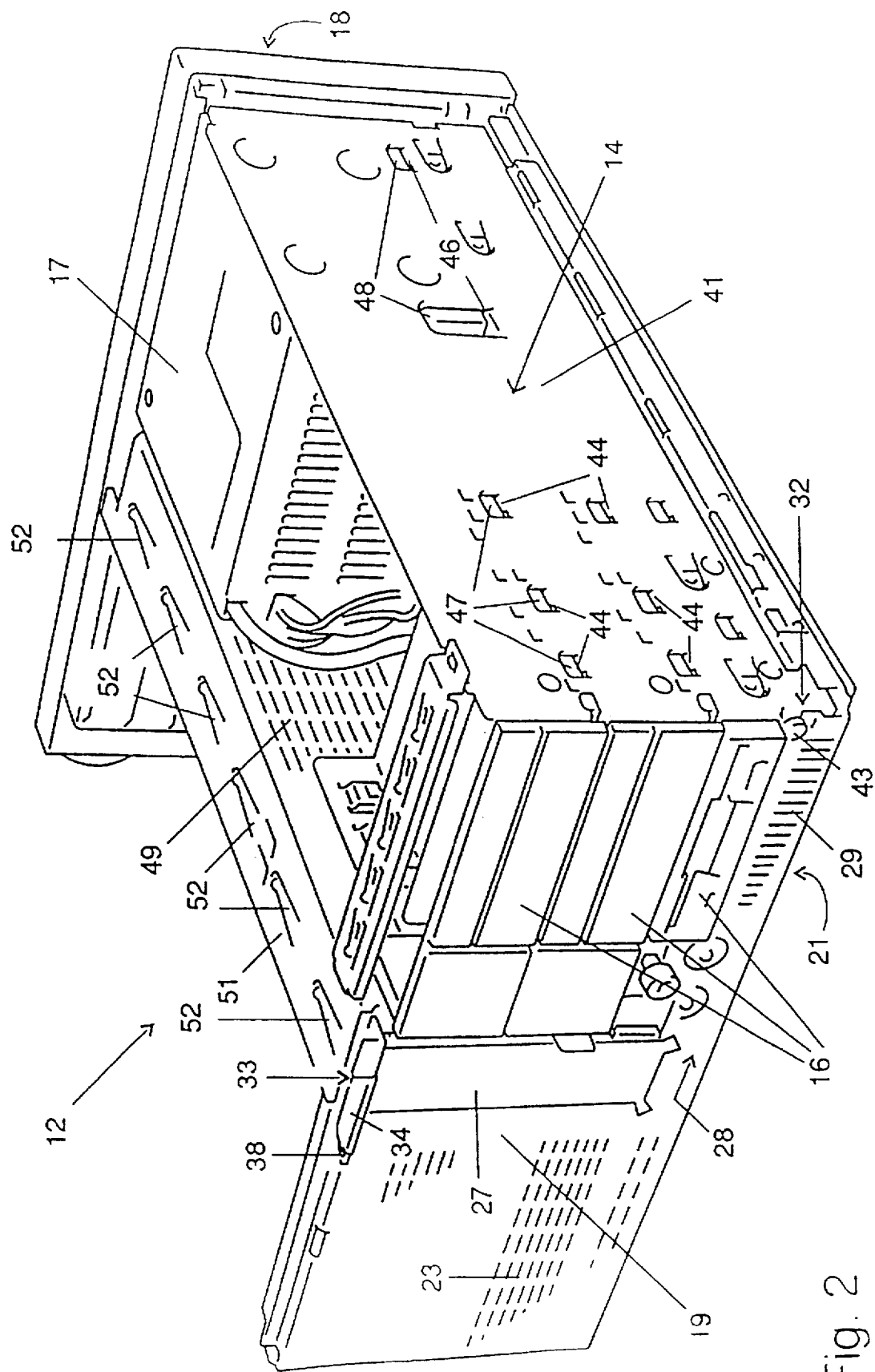
FIG. 2 is a perspective view of the internal structure of the processor unit of FIG. 1.
Figure 3:
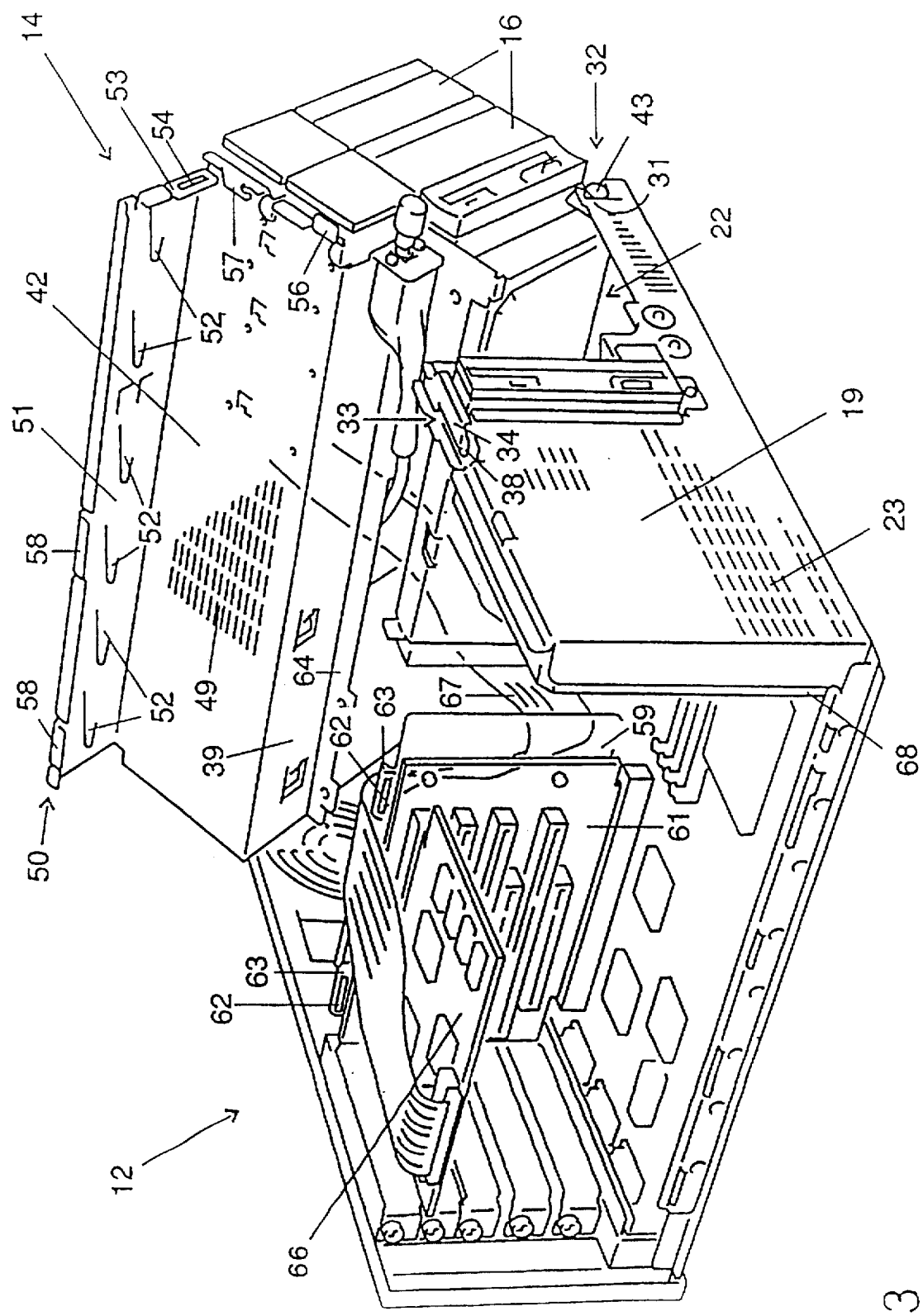
FIG. 3 is a perspective view of the auxiliary frame of the processor unit of FIG. 1 in one of its operative positions.

The right-hand side wall 41 of the frame 14, shown in the foreground of FIG. 2. consists of metallic material and houses elements for locking and guiding the magnetic peripheral unit 16 and the power supply unit 17. In particular, tongues 44 for supporting the magnetic peripheral unit and tongues 46 for supporting the supply unit 17 are provided in the wall 41. These tongues form a supporting base for the guides 47 for mechanically supporting the peripherals and for a frame 48 for housing and supporting the power supply unit 17.

The left-hand side wall 42 of the auxiliary frame 14 has a grille 49 to make the metal structure lighter and for further ventilation of the interior. The upper end part of the side wall 42 is bent at an angle of 90° so as to form a horizontal metal crossbar 51 to support the PC display screen (monitor). This crossbar 51, laterally delimited by a long edge 50, moreover carries contact elements 52 ensuring good electrical connection between the metal structure of the main frame 12 and an inner metal coating of the cover 11. This structure optimises the shielding action of the cover against the emission of radio-frequency radiation by the PC.

The other part of the second interlocking mechanism 33, formed by a tongue 53 on which a second small hole 54 is formed, is arranged in the front part of the crossbar 51. The bolt 34 is introduced into this second small hole 54 to lock the auxiliary frame 14 to the base 13. The front edge of the wall 42 is completed by a tab 56 and an auxiliary lock 57 used as a further aid when assembling and dismantling the PC for easier access to the first and second mechanical and/or electronic components.

The long edge 50 of the crossbar 51, parallel to the wall 42, is bent into an L shape in order to brace the mechanical structure for supporting the PC display screen. Locking and supporting notches 58 for a metal support 59 are formed on this edge. This metal support 59 supports a bus expansion board 61 which can carry expansion boards 66 supporting integrated circuits and other electronic components. When the auxiliary frame 14 is closed, the notches 58 are located in eyelets 62 of tabs 63 provided on the upper edge of the support 59.

The base 39 of the auxiliary frame 14 includes a longitudinal member 64 used as a reinforcing rib for the base and as a support for locking the magnetic expansion peripheral (e.g. hard disk store unit) fixed above the base 13 and below the auxiliary frame 14. The longitudinal member 64 is not supported over its entire length on the base 13, but has a port for the passage of cables 67 connecting the magnetic peripherals and the mother-board of the PC.

The front wall 19 is moreover provided in its left-hand inner part with a card guide 68 covered towards the exterior by the grille 23.

Figure 6:
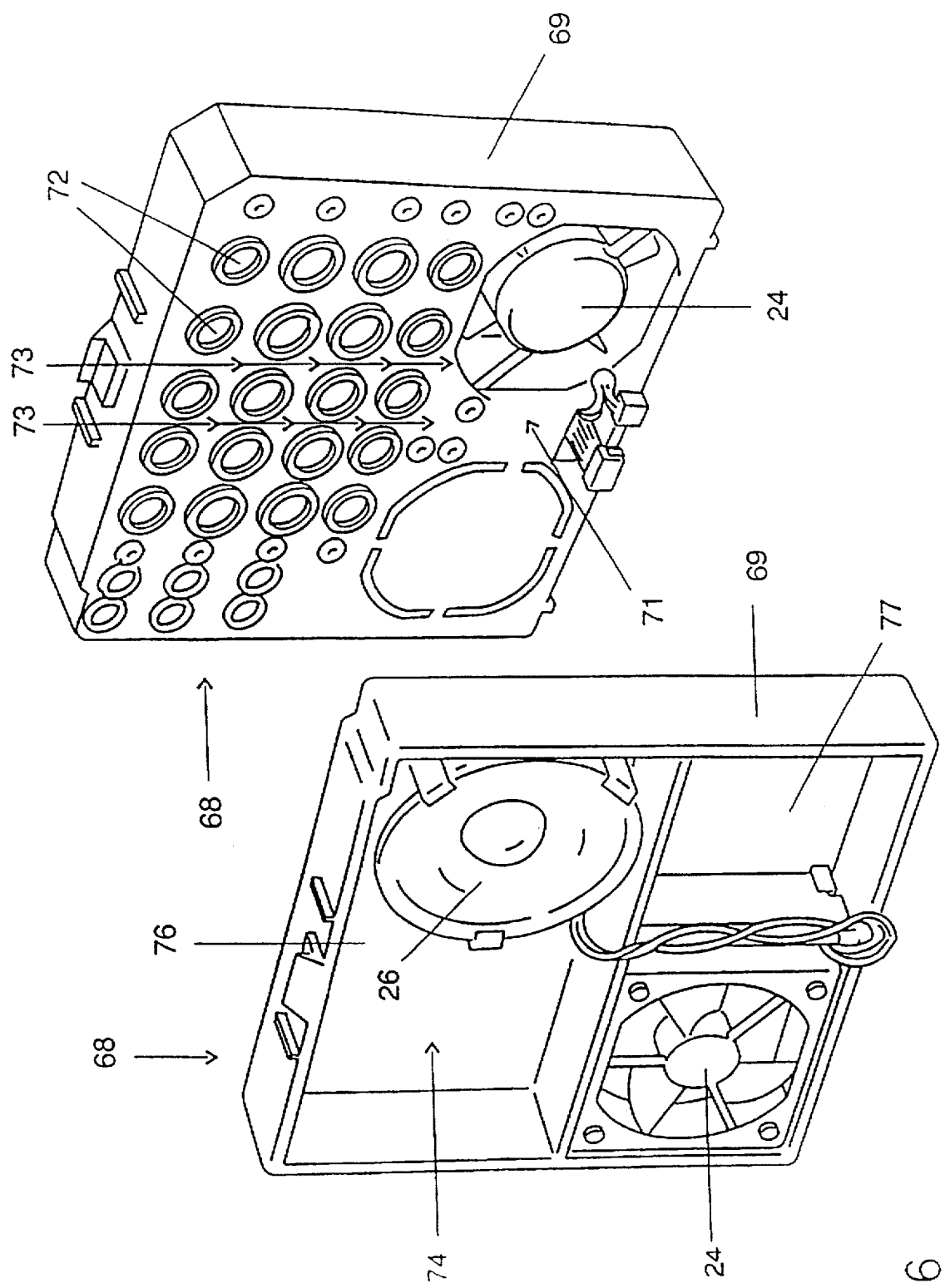
FIG. 6 shows a front perspective view and a rear perspective view of a part of the processor unit

The card guide 68, shown in two views in FIG. 6, consists of a body 69 substantially in the shape of a parallelepiped, e.g. of plastic material, comprising a first face 71 directed towards the interior of the PC on which are provided pairs of projections 72 facing one another and separated by an appropriate spaces 73, and a second face 74 opposite the first face and directed towards the front wall 19. The projections 72 are formed by continuous and/or discontinuous rings separated by the space 73 of appropriate dimensions in order to support the expansion boards of the PC and to guide them as they are inserted. The projections 72 are aligned in both the directions parallel with and perpendicular to the base wall 21.

The second face 74, directed towards the front wall 19, comprises a first seat 76 for housing an audible signalling device for the PC, e.g. a buzzer or loudspeaker 26, and a second seat 77 for housing the fan 24 for ventilating the interior of the computer.

It will be clear that the electronic processor unit illustrated can be subject to modifications and/or additions and/or the substitution of components without thereby going beyond the scope of the invention; for example, the construction of the seat 31 may be such that the auxiliary frame 14 can be separated from the base 13 when the frame is in the open or access position.

We claim:

1. An electronic processor unit comprising a base (13) having a front wall (19), said base (13) adapted to support first mechanical and/or electronic components (24,61); an auxiliary frame (14) adapted to support second mechanical and/or electronic components (16,17); interlocking means (32) for the base and the auxiliary frame so that the auxiliary frame can be moved between a rest position and an access position, the auxiliary frame permitting access to the first and second mechanical and/or electronic components (16, 17,24,61) in the said access position; and a fixing mechanism which can be selectively actuated in order to lock the auxiliary frame to the base in the rest position, the fixing mechanism comprising first locking means (34,37) in the base (13) and second locking means (54) in the auxiliary frame (14), one of the locking means being selectively actuatable in order to cooperate with the other locking means in the rest position of the auxiliary frame; characterised in that the first locking means are disposed on the front wall (19) of the base and comprise a hook (34) free to rotate about a fulcrum (38), and a shoulder (36) having a small hole (37); the second locking means comprise a tongue (53) with an associated eyelet (54); and the shoulder (36) and the tongue (53) are adapted to cooperate with the hook, and the small hole (37) and the eyelet (54) are adapted to house the hook (34) in order to lock the auxiliary frame (14) in the rest position.

2. An electronic processor unit according to claim 1, characterised in that the front wall (19) is adapted to house part of the first mechanical and/or electronic components (24).

3. An electronic processor unit according to any of the preceding claims, characterised in that the interlocking means (32) comprise a pivot (43) integral with the auxiliary frame (14) and a seat (31) provided on the base (13) and adapted to removably house the pivot in order to rotate the auxiliary frame about an axis of rotation and/or to separate it from the base in the access position.

4. An electronic processor unit according to claim 3, in which the base (13) is substantially in the shape of a parallelepiped and is delimited by a base surface (21) and by lateral surfaces (18,19) adjacent to the base surface, characterised in that the axis of rotation is parallel to a dihedron defined by the base surface and by one of the lateral surfaces.

5. An electronic processor unit according to claim 1, comprising a casing (11) having protective means acting as an electromagnetic shield for the said first and second components, characterised by contact elements (52) provided in the auxiliary frame (14) and adapted to electrically connect the auxiliary frame to the protective means in order to optimise the shielding action of the casing.

6. An electronic processor unit according to claim 1, characterised in that the auxiliary frame (14) is adapted to support a plurality of peripheral units (16,17) of the processor unit in a modular manner.

7. An electronic processor unit according to claim 6, characterised in that the peripheral units comprise magnetic and/or optical stores (16).

8. An electronic processor unit according to claim 1, characterised in that the auxiliary frame (14) supports a power supply for supplying power to the said first and second electronic components (24,61,16,17).

9. An electronic processor unit according to claim 1, in which the base (13) supports a main electronic board (61) and auxiliary electronic boards (66) on which the first mechanical and/or electronic components are mounted, and in which the auxiliary electronic boards are removably fixed to the main electronic board, characterised in that the auxiliary frame (14) allows for access to and possibly replacement of the main and auxiliary electronic boards in its access position.

* * * * *